United States Patent [19]
Yamazaki

[11] Patent Number: 5,987,731
[45] Date of Patent: Nov. 23, 1999

[54] ELONGATED SUPERCONDUCTIVE MEMBER

[75] Inventor: Shumpei Yamazaki, Tokyo, Japan

[73] Assignee: Semiconductor Energy Laboratory Co., Ltd., Kanagawa, Japan

[21] Appl. No.: 08/473,950

[22] Filed: Jun. 7, 1995

Related U.S. Application Data

[62] Division of application No. 07/485,854, Feb. 22, 1990, Pat. No. 5,474,975, which is a continuation of application No. 07/174,165, Mar. 28, 1988, abandoned.

[30] Foreign Application Priority Data

| Apr. 1, 1987 | [JP] | Japan | 62-81488 |
| Apr. 1, 1987 | [JP] | Japan | 62-81489 |

[51] Int. Cl.$^6$ ................................. H01L 39/24
[52] U.S. Cl. .................... 29/599; 138/140; 138/148; 174/15.2; 174/15.4; 427/62; 428/614
[58] Field of Search ............................. 29/599; 505/100, 505/433, 430, 880, 885; 428/614; 174/15.4, 15.5, 126.4; 427/62; 138/140, 143, 177, 178

[56] References Cited

U.S. PATENT DOCUMENTS

| 2,139,431 | 10/1938 | Vatter ........................................ 113/112 |
| 2,332,891 | 10/1943 | Clark ......................................... 175/41 |
| 3,158,794 | 11/1964 | Swartz ....................................... 335/216 |
| 3,205,413 | 9/1965 | Anderson . |
| 3,214,249 | 10/1965 | Bean et al. ................................. 29/599 |
| 3,310,433 | 3/1967 | Tragert . |
| 3,325,888 | 6/1967 | Weinig ...................................... 29/599 |
| 3,408,235 | 10/1968 | Berghout et al. ..................... 29/599 X |
| 3,428,926 | 2/1969 | Bogner et al. ........................... 335/216 |
| 3,444,495 | 5/1969 | Thomas .................................... 336/223 |
| 3,447,913 | 6/1969 | Yntema .............................. 428/614 X |
| 3,472,944 | 10/1969 | Morton et al. ............................. 174/15 |
| 3,493,809 | 2/1970 | Weissman ............................. 29/599 X |
| 3,713,211 | 1/1973 | Freeman, Jr. ............................. 29/599 |
| 3,728,463 | 4/1973 | Kullmann et al. ........................ 174/12 |

(List continued on next page.)

FOREIGN PATENT DOCUMENTS

| 51-16757 | 5/1976 | Japan . |
| 52-69295 | 6/1977 | Japan ........................................ 29/599 |
| 54-22592 | 8/1979 | Japan ........................................ 29/599 |
| 56-66080 | 6/1981 | Japan . |
| 57-53011 | 3/1982 | Japan . |
| 57-164504 | 10/1982 | Japan . |
| 5753011 | 3/1987 | Japan . |
| WO88/08618 | 11/1988 | United Kingdom . |

OTHER PUBLICATIONS

"Y–Ba–Cu–O Films Prepared By a Paint–on Method" Appl. Phys. Lett., vol. 52 No. 9, Feb. 29, 1988 I. Shih and C. X. Qiu, pp. 748–750.

"Ba–Y–Cu–O Superconducting Tape Prepared by Surface Diffusion Process", vol. 26, No. 7, Jul., 1987, pp. L1172–L1173 Hiroaki Kumakura et al., National Research Institute for Metals.

"Preparation of Superconducting Y–Ba–Cu–O Thick Film", Japanese Journal of Applied Physics, vol. 27, No. 3, Mar., 1988, pp. L420–L422, Mineo Itoh and Hiroyuki Ishigaki.

"High $T_c$ Superconductors—Composite Wire Fabrication", Appl. Phys. Lett. 51(3), Jul. 20, 1987, pp. 203–204 1987 American Institute of Physics, S. Jin et al.

(List continued on next page.)

*Primary Examiner*—Carl J. Arbes
*Attorney, Agent, or Firm*—Sixbey, Friedman, Leedom & Ferguson, P.C.; Gerald J. Ferguson, Jr.; Jeffrey L. Costellia

[57] ABSTRACT

A method for manufacturing an elongated member from a superconducting ceramic material comprising the steps of providing a hollow supporting body of metal or a metallic compound having a hollow inside section therein, introducing a superconducting ceramic material into the hollow inside section of the hollow supporting body, drying the above liquid, so that the superconducting ceramic material is coated on the inside of the supporting body; and firing the supporting body and the ceramic material in an oxidizing atmosphere.

37 Claims, 1 Drawing Sheet

U.S. PATENT DOCUMENTS

| | | |
|---|---|---|
| 3,864,807 | 2/1975 | Schneider et al. .................. 428/614 X |
| 3,963,425 | 6/1976 | Sambrook ............................ 428/614 X |
| 4,316,785 | 2/1982 | Suzuki et al. . |
| 4,329,539 | 5/1982 | Tanaka et al. .......................... 174/128 |
| 4,407,062 | 10/1983 | Sutcliffe et al. . |
| 4,421,946 | 12/1983 | Furuto et al. ............................ 174/128 |
| 4,492,089 | 1/1985 | Rohner ........................................ 62/55 |
| 4,571,453 | 2/1986 | Takaoka et al. ......................... 174/110 |
| 4,640,816 | 2/1987 | Atzmon ................................. 29/599 X |
| 4,704,249 | 11/1987 | Glatzle ................................. 29/599 X |
| 4,754,249 | 6/1988 | Yamamoto et al. .................... 335/216 |
| 4,785,142 | 11/1988 | Smith et al. ............................... 174/15 |
| 4,804,649 | 2/1989 | Sherif ......................................... 505/1 |
| 4,813,332 | 3/1989 | Jasper, Jr. ...................................... 89/8 |
| 4,843,059 | 6/1989 | Deslandes et al. ......................... 505/1 |
| 4,885,273 | 12/1989 | Sugimoto et al. ....................... 505/433 |
| 4,952,559 | 8/1990 | Jin et al. ..................................... 505/1 |
| 5,006,507 | 4/1991 | Woolf et al. ............................... 505/1 |
| 5,011,823 | 4/1991 | Jin et al. ............................. 505/740 X |
| 5,044,406 | 9/1991 | Yamazaki ................................ 138/143 |
| 5,081,075 | 1/1992 | Jin et al. ............................... 29/599 X |
| 5,100,865 | 3/1992 | Yamamoto et al. .................. 427/62 X |

OTHER PUBLICATIONS

"High Tc Superconducting Y–Ba–Cu–O Thick Film By Screen Printing", H.H. Yen et al., Materials Research Laboratories, Industrial Technology Research Institute.

"Bulk Superconductivity at 36K in $La_{1.8}Sr_{0.2}CuO_4$" by R.J. Cava et al., Physical Review Letters, vol. 58, No. 4, Jan. 26, 1987.

*Asahi Newspaper* (Mar. 9, 1987) "A Cu–Ni sheath filled with lanthanum–strontium powders is elongated to form a ribbon or a wire. Although a heat is not applied, a superconductivity can be realized due to a pressure.".

"Materials At Low Temperatures" *American Society For Metals* (1983).

*Material Science Of Ceramics*, Apr. 10, 1985, "brittleness of ceramic materials.".

*Zeitschrift fur Physik B Condensed Matter*, vol. 64, No. 2, 1986.

Shin–ichi Ueda et al., *Japanese Journal of Applied Physics*, 26 (1987) L151–152.

*Ceramic–Science*, 1974, "teaches an enamal, that is, a metal coated with a glass and baked at high temperatures.".

*Journal of Low Temperature Physics*, vol. 53, No. 3/4, 1983.

*Nikkei Sangyo Newspaper*, Mar. 13, 1987.

*Nihon Kougyou Newspaper*, Mar. 19, 1987.

*Dictionary of Ceramics*, teaches the formation of an enamel.

Proc. Intr. Conf. Low Temp Physics Kyeto, 1987 Japanese Journal of Applied Physics, vol. 26 (1987) Supplement 26–3, Superconducting Wires of High Tc Oxides by K. Ohmatsu et al. (29/599).

ELONGATED SUPERCONDUCTIVE MEMBER

This is a Divisional application of Ser. No. 07/485,854 filed Feb. 22, 1990 now U.S. Pat. No. 5,474,975; which itself is a continuation of Ser. No. 07/174,165 filed Mar. 28, 1988, now abandoned.

FIELD OF THE INVENTION

The present invention relates to a method for manufacturing an elongated member such as pipe or wire from a ceramic superconducting material, and in particular to a method for manufacturing a pipe or wire for fabricating a coil for use in a superconducting magnet or in an electrical accumulator device.

BACKGROUND OF THE INVENTION

Conventionally, a metallic material such as Nb-Ge (for example, $Nb_3Ge$) and the like is used as a superconducting material. Because this material is a metal, it has high ductility, malleability, and flexure and can be used to construct a coil for use in a superconducting magnet and also a coil for use in an electricl accumulator coil.

However, the onset of the superconducting critical temperature (hereinafter referred to as Tc) of this metal is low, being only 23° K. or lower. On the other hand, for industrial applications, it is extremely important that the Tc be 100° K. or higher, and that the temperature where the electrical resistance becomes zero (hereinafter referred to as Tco) be 77° K. or higher.

Recently, a copper oxide ceramic superconducting material has been attracting considerable attention as such a superconducting material. However, this copper oxide ceramic superconducting matrerial is not necessarily adequate in ductility, malleability, and flexure. Also, there is a problem that processing the material after it is formed is extremely difficult.

For these reasons, no method is as yet known for preparing this copper oxide ceramic superconducting material for use in the form of a coil, nor is any structure with such a coil known wherein a cooling medium can be incorporated therein for cooling the material.

SUMMARY OF THE INVENTION

An object of the present invention is to provide, with due consideration to the drawbacxks of such conventional devices, a method for manufacturing an elongated member such as pipe or wire from a ceramic superconducting material.

A further object of the present invention is to provide a method for manufacturing an elongated member such as pipe or wire for fabricating a coil for use in a superconducting magnet or in an electical accumulator device.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1:
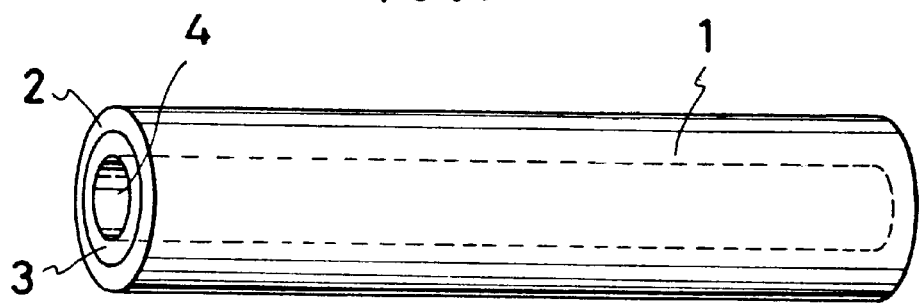
FIG.1 shows a superconducting ceramic pipe of the present invention.

To satisfy the objects of the present invention, a hollow body of metal or metallic compound is used as a supporting member, and a material which is intended as the superconducting material is introduced in the form of a slurry, in solution, or in ger form into the hollow body or pipe with one end of the hollow pipe temporarily blocked whereby the material is poured through the other end.

Next, the entire hollow pipe is heated from the outside and the solvent, that is a liquid meium, is completely removed by vaporization. This causes the superconducting material to be coated onto the inner -wall of the hollow pipe. Then by heating the coating for firing and oxidizing or reducing it repeatedly, a ceramic superconducting material, for example, an oxidized copper ceramic, is formed which has a molecular structure represented by $(A_{1-x}B_x)_yCu_zO_w$, where x=0 to 1, y=2.0 to 4.0 and preferably 2.5 to 3.5, z=1.0 to 4.0 and preferably 2.5 to 3.5, and w=4.0 to 10.0 and preferably 6.0 to 8.0, and A is an element selected from Group IIIa of the Periodeic Table, for example Y(yttrium), Gd(gadolinium), Yb(ytterbium), or other lanthanides, and B is an element selected from Group IIIa of the Periodic Table, for example, Ba(barium) or Sr(strontium), Ca(calcium).

In the ceramic superconducting material used in the present invention elements depicted by A and B other than those mentioned above can be added.

In the present invention, the coating of the superconducting ceramic material can be formed in a dual structure wherein a first layer is formed on the inside wall of the hollow support body and then a second layer of ceramic material is coated over the first layer by repeating the process after the first layer of the ceramic material is sufficiently solidified. In addition, in this case, the types of A and B, and the values for x,y,z, and w may be changed.

In the present invention, if a large quantity of ceramic is to be filled into the inside of the hollow supporing body, an auxiliary body made of organic material in a hollow pipe form which is vaporized into carbon dioxide gas or the like when fired in an oxidizing atmosphere is provided in the interior of the hollow supporing body or pipe. A superconductimg material, which may either be used with or without solvent, is then filled into the space between the hollow supporting body and the auxiliary body. After this, the auxiliary body is oxidized and vaporized by heating and firing, further, the inside ceramic material is oxidized to change into a ceramic superconducting member.

In the method of the present invention, the ceramic material coated on the inside surface of the supporting pipe formed from a metal or its compound is changed through oxidization into a ceramic superconducting member represented by the general formula $(A_{1-x} B_x)_yCu_zO_w$ which exhibits superconductivity. It is important that sufficient oxygen be added to this ceramic material when it is crystallized into the most suitable crystals. In the method of the present invention, the outside is covered with a metal, so that it is possible to adequately control the atmosphere on the ceramic material in the pipe. The hollow structure is effective in actual use in keeping the superconducting material at a lower temperature, because a gas (for example,liquid nitrogen) is introduced into the hollow space to cool the ceramic superconducting material to a temperature at which this ceramic exhibits superconductance.

In the present invention, this process may be further repeated to form a structure with a plurality of layers.

In order to fabricate a pipe or coil using the metallic superconducting material as mentioned above, conventionally, first a wire is fabricated by this process, then this wire is wound around a prescribed base to form a coil.

However, this kind of wire forming using the ceramic superconducting body or winding the ceramic superconducting body around the base is extremely difficult.

For this reason, in the present invention, a pipe of metal or metallic compound is used, fabricated in the form of a previously prescribed pipe, coil or endless coil with its starting and terminating ends connected to each other. Its interior is filled by the introduction of a liquid in which a super-conducting ceramic material is slurried or dissolved. It is therefore possible to essentially create the final form of a pipe of a ceramic material by providing a coating of the superconducting material on the inside wall of the metal pipe.

In addition, by winding a plurally of turns in coil using the pipe of the present invention, a superconducting magnet can be formed. Also, by connecting the starting and terminating ends of this coil through the ceramic material having the electrical resistance of zero, an endless coil is obtained. There is no loss of current in tr coil, so it is possible use it as an electrical energy storage device.

FIRST EXAMPLE

In this example, a composition was used in the expression $(A_{1-x}B_x)_yCu_zO_w$, where A is yttrium in the form $Y_2O_3$, B is barium in the form $BaCO_3$, and copper is used in the CuO form. These chemicals were used at 99.95% or greater in purity. The x,y,z, and w used here were adjusted to the form $(YBa_x)Cu_3O_{6-8}$. These raw materials were blended in an agate mortar, compacted into tablets at a pressure of 300 kg/cm², and pre-fired in air, first at 700° C. for 3 hours, then at 1000° C. for 10 hours. The tablets were then pulverized into powder once again. The average particle size was made 100 μm or less, for example, about 10 μm. This mixture wap enclosed in a capsule and again compacted at 500 kg/cm² to form tablets. These tablets were then fully fired in an oxidizing atmosphere, for example, in air, at 800° C. to 1000° C. for 10 hours.

Next the fact that this fired material had a To onset of 95° K. or greater and a Tco of 77° K., or greater was confirmed from the voltage, current, and temperature characteristics.

The tablets were once again pulverized into a fine powder. The average particle size ranged from 0.05 μm up to 100 μm, for example, 3 μm. In this process, an effort was made during pulverization to avoid destroying the basic crystal structure.

This powder was slurried or dissolved in a liquid, for example, freon liquid, or an alcohol such as ethanol, or another liquid.

This liquid was poured into the hollow support body shown in FIG. 1 which is a metal pipe 2 fabricated, for example, from copper or copper compound such as a NiCu compound), with its opposite end blocked. The inner wall of the pipe 2 was coated to a uniform thickness with the ceramic powder by rotating, turning and vertically vibrating the pipe 2 from end to end so that the powder is adhered to the wall while the entire pipe 2 was heated to a temperature of 100° C. to 400° C.

In this way, the solvent was removed from the inside of the pipe 2 resulting in the inner wall with a ceramic powder coating 3 formed thereon.

It may be mixed with propylene glycol, octyl alcohol, peptyl alcohol, and the like, in paste form to make the coating adhere more easily to the inner wall.

After this, while oxygen or a mixture of oxygen and argon gas was introduced into the hollow section for oxidizing, the ceramic material was heated and fired at 500° C. to 1100° C., for example, at 600° C. for 3 hours, then additionally at 800° C. for 5 hours to cause the ceramic to adhere to the inner wall.

By repeating this type of process 1 to 5 times, the ceramic material was caused to adhere to the inside of the pipe to an average thickness of 50 μm to 1 cm (as a representative figure, 0.5 mm to 5 mm). In this way, the pipe 1 as shown in FIG.1 was fabricated comprising the hollow supporting body 2 and the superconducting ceramic material 3 with the empty space 4 provided in the inside of the hollow supporting body 2.

In the present example, the pipe has a cylindrical hollow supporting body. However, it may also be a square hollow supporting body, and other shapes can also be used.

The superconducting ceramic pipe in this example had a Tc value 5 to 20° K. lower than that made from the tablet. However, it is possible to say that this is an improvement and better than the Tc from the initial tablet.

In addition, the length in this design can be changed from several centimeters to several scores of meters. Also, the thickness can be changed from a diamator of several millimeters to one of several centimeters.

SECOND EXAMPLE

In this example, a dual pipe structure was made in which a hollow second pipe made of an organic material with a diameter smaller than that of a first hollow pipe as mentioned in the first example was placed beforehand inside the hollow first pipe. Then the material formed by grinding the fired superconducting material fabricated in the intermediate process of the first example was filled between the two pipes.

Oxygen was passed through the interior of the second pipe of organic material and the entire assembly was heated. The organic material was carbonized at about 300° C., and further as the temperature was raised, vaporized to carbon dioxide gas and driven off. After this, the filled ceramic material was completely oxidized to produce the superconductng material. This process was completed at a temperature between 600° C. and 1100° C., for example, at 800° C. to 1000° C., for 10 to 20 hours.

Thus, it was possible to fabricate a metal pipe provided with a superconducting ceramic material on its inside with a hollow section formed,therein In this example, it was found that it is effective to fill the superconducting ceramic material between the hollow supporting body or first pipe and the hollow auxiliary body or second pipe in the form of powder mixed in a flowable organic paste which is easily vaporized.

Unless specifically stated, the rest of the method of this example is substantially identical to that of the first example.

THIRD EXAMPLE

Figure 2:
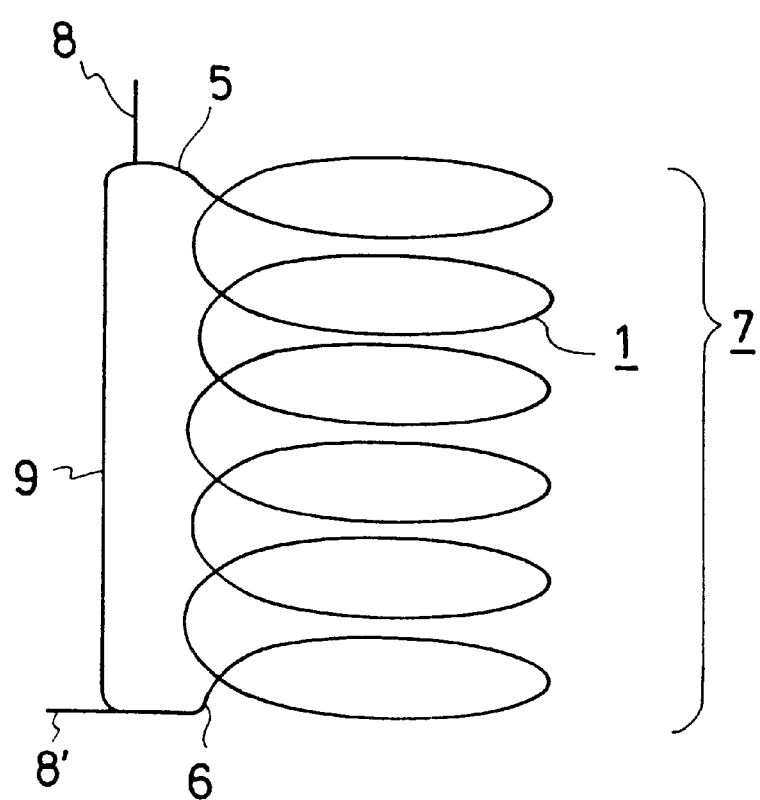
FIG. 2 shows an example of an electrical storage device using the pipe of the present invention.

In this example, an endless coil was used. FIG.2 shows a vertical cross section of the endless coil. This endless coil can be used as a battery for electric energy genetrated by a solar cell and the like.

As can be seen from this diagram, a pipe which was fabricated from a metal or a precious metal compound, with a peviously-formed hollow space, as in the first example, was formed in the shape of a coil 7. In addition, a starting end 5 and a terminating end 6 were detachably connected to each other through a hollow pipe 4. A resistance was provided in parallel to this connector section as a means for applying electrical power. This endless coil has a filler opening 8. This filler opening 8 can be used as input and output terminals for electrical energy.

Here, using the same method as in the first example, the superconducting ceramic material was slurried or dissolved in a liquid, which was poured into the filler opening 8. It can also be filled as in the second example.

To dry the superconducting ceramic material, the unnecessary solvent was driven off in the form of vapor through the openings 8, 8' and the inside of the pipe was dried. Also, in the same way as in the first example, an oxidizing gas was introduced and the ceramic was dried.

In this way, the endless coil 7 with a hollow interior could be fabricated using the pipe 1 of which the inner wall was coated with the superconducting ceramic material. Its Tco was experimentally determined to be 78° K. However, by proper selection of the superconducting ceramic material, a higher Tco can be obtained. Also, a closed circuit of zero resistance can be obtained with the endless coil introducing liquid nitrogen into the hollow section of the endless coil, so that it can be used as an electric energy storage device.

FOURTH EXAMPLE

In this example, in the expression $(A_{1-x}B_x)_yCu_zO_w$, A was Yb and B was Ba. Therefore, the Tco of the pipe formed was maintained at 85° K. Otherwise this example was substantially the same as the first and second examples.

With this structure for the present invention, with the outside covered with metal, the oxidation of the ceramic material on the inside and the process can be controlled by the type and amount of gas fed into the hollow section. Further, it is important in the present invention to provide a central section to relieve the stress and strain during production because the volume is slightly enlarged by oxidation of the superconducting ceramic material. Also, this is effective for reducing the difference in the coefficient of expansion between the metal and ceramic materials.

In such a pipe structure formed for the present invention, the hollow inner section is filled with a cooling liquid such as liquid nitrogen, so that continuous and simultaneous direct cooling of the pipe and the ceramic is possible, for which temperature control is of the most importance.

In addition, it is also possible to use compounds other than copper or a copper compound as the outside metal . However, use of copper or a copper compound makes it possible to weld the outside of the pipe, so that it can be usd as part of an electrical device. Using copper or a copper compound as the metal or metallic compound especially makes it possible to widen the application of this pipe, for example, to use it in electrical parts.

A preferred method of preparing the superconducting ceramic material in the present invention is to powder a previously prepared ceramic material of this type and mix it with a liquid. Also, a solidifying method and other methods can also be used.

In another aspect of the present invention, a wire drawing step can be introduced to form a wire as in the following example, which is then wound around a substrate or base to form a coil of the metallic superconducting material

FIFTH EXAMPLE

The starting material for this example was the hollow pipe of the first or second example. It was heated between 800° C. and 1100° C.for example, at 1000° C. The outside of the pipe was formed with soft copper. It has a low melting point of 1083° C. and has good malleability and ductility. Therefore, upon the implementation of heat treatment of the superconducting ceramic matrerial, residual stresses are suppressed so that cracks are not produced.

In practice, the copper pipe had an outside diameter of 10 mm and an inside diameter of 8 mm, the average thickness of the ceramic material was 3 mm, and the hollow section was about 2 mm in diameter. The whole pipe was heated from the outside so that it became elongated to form a long wire as it is forced through a jig. Consequently, the diameter of the pipe was reduced and it was possible to completely eliminate the hollow space therefrom. With this process, even when a thin wire is formed, because a hollow pipe was used as the starting material, incidents such as the supercondcting phenomenon not being produced because of remained stress in the certamic, can be avoided.

In this manner a pipe with an outer diameter of 6 mm can be stretched to a length about three times that of the starting material.

As this technology develops, it should be possible to stretch pipe with a diameter as small as 1 mm to 2 mm, to a length 50 to 5000 times the original.

Thus, when the structure of the metallic pipe and the superconducting material coated thereon is subjected to wire-drawing, because a hollow space is contained therein, the ceramic material is not failed upon wire-drawing.

The superconducting ceramic material for use in accordance with the present invention also may be prepared consistent with the stoichiometric formula $(A_{1-x}B_x)_yCu_zO_w$, where A is one or more elements of Group IIIa of the Periodic Table, e.g. the rare earth elements, B is one or more elements of Group IIa of the Periodic Table, e.g. the alkaline earth metals including beryllium and magnesium, and x=0 to 1, y=2.0 to 4.0, preferably 2.5 to 3.5, z=1.0 to 4.0, preferably 1.5 to 3.5, and w=4.0 to 10.0, preferably 6.0 to 8.0.

Also suprerconcucting ceramics for use in accorcdance with may be presented by the stoichimometridc formula $(A_{1-x}B_x)_yCu_zO_w$, where A is one or more elements of Group Va of the Periodic Table, e.g. Bi, Sb and As; B is one or more elements of Group IIa of the Periodic Table, e.g. the alkaline earth metals including beryllium and magnesium, and x=0 to 1, y=2.0 to 4.0, preferably 2.5 to 3.5, z=1.0 to 4.0, preferably 1.5 to 3.5, and w=4.0 to 10.0, preferably 6.0 to 8.0.

One exmple of the formula is $YBa_2Cu_3O_x$ (x=6 to 8), and exmples of the latter formula is $BiSrCaCu_2O_x$ and $Bi_4Sr_3Ca_3Cu_4O_x$. In addition, the composition $Bi_4(Sr_yCa_2)Cu_4O_x$ is possible for such purposes and its Tc is 40 to 60 when the value of y is about 1.5. The Tonset and Tco of the composition $Bi_4Sr_4Ca_2Cu_4O_x$ are 110° K. and 79° K., respectively. The value of x in the above formulae is estimated to be 6 to 10, for example about 8.1.

The stoichiometric formulae mentioned above can be determined for example by X-ray diffraction.

What is claimed is:

1. An elongated member comprising:
    an elongated hollow supporting body; and
    a filling of an oxide superconducting ceramic material within said elongated supporting body, said oxide superconducting ceramic material having a Tco of 77° K or higher.

2. The member as defined in claim, 1, wherein said hollow supporting body is of a metal or metallic alloy.

3. The member as defined in claim 1, wherein said supporting body is of an organic material.

4. The member as defined in claim 1, wherein said elongated member is in the form of a wire, said wire being wound to form a coil having first and second ends.

5. The member as defined in claim 4, wherein said first and second ends of said coil are connected thereby forming an endless coil.

6. The member as defined in claim 1, wherein said elongated member is of a circular cross-section.

7. The member as defined in claim 1, wherein said elongated member is of a polygonal cross-section.

8. The member as defined in claim 1, wherein said oxide superconducting ceramic material is a copper oxide having a formula represented by $(A_{1-x}B_x)_yCu_zO_w$, where x=0 to 1, y=2.0 to 4.0, z=1.0 to 4.0, and w=4.0 to 10.0; A is an element selected from a group including Y (yttrium), Gd (gadolinium), Yb (ytterbium), and other lanthanides; B is selected from a group including Ba (barium) or Sr (Strontium), Ca (calcium), Mg (magnesium), and Be (beryllium).

9. A coil for use in a superconducting electric energy accumulator comprising:
   an elongated hollow supporting body wound in the form of a coil having a first end and a second end; and
   a filling of an oxide superconducting ceramic material within said supporting body, said oxide superconducting ceramic material having a Tco 77° K or higher.

10. The coil as defined in claim 9, wherein the coil is an endless coil having said first and second ends connected to one another.

11. The coil as defined in claim 9, wherein said hollow supporting body is of a metal or metallic alloy.

12. The coil as defined in claim 9, wherein said supporting body is of an organic material.

13. The coil as defined in claim 9, wherein said coil is of a circular cross-section.

14. The coil as defined in claim 9, wherein said coil is of a polygonal cross-section.

15. The member as defined in claim 9, wherein said oxide superconducting ceramic material is a copper oxide having a formula represented by $(A_{1-x}B_x)_yCu_zO_w$, where x=0 to 1, y=2.0 to 4.0, z=1.0 to 4.0, and w=4.0 to 10.0; A is an element selected d from a group including Y (yttrium), Gd (gadolinium), Yb (ytterbium), and other lanthanides; B is selected from a group including Ba (barium) or Sr (Strontium), Ca (calcium), Mg (magnesium), and Be (beryllium).

16. An endless coil, for use in a superconducting magnet comprising:
   a continuous elongated hollow support body wound in the form of a coil; and
   a filling of an oxide superconducting ceramic material within said elongated body, said oxide superconducting ceramic material having a Tco of 77° K or higher.

17. The coil as defined in claim 16, wherein said hollow supporting body is of a metal or metallic alloy.

18. The coil as defined in claim 16, wherein said supporting body is of an organic material.

19. The coil as defined in claim 16, wherein said coil is of a circular cross-section.

20. The coil as defined in claim 16, wherein said coil is of a polygonal cross-section.

21. The coil as defined in claim 16, wherein said oxide superconducting ceramic material is a copper oxide having a formula represented by $(A_{1-x}B_x)_yCu_zO_w$, where x=0 to 1, y=2.0 to 4.0, z=1.0 to 4.0, and w=4.0 to 10.0; A is an element selected from a group including Y (yttrium), Gd (gadolinium), Yb (ytterbium), and other lanthanides; B is selected from a group including Ba (barium) or Sr (Strontium), Ca (calcium), Mg (magnesium), and Be (beryllium).

22. A member comprising:
   a hollow supporting body; and
   a filling of an oxide superconducting ceramic material within said elongate supporting body, said oxide superconducting ceramic material having a Tco 77 K or higher,
   said member formed by a process comprising:
      preparing a powder of said oxide superconducting ceramic material having a Tco 77 K or higher wherein said powder has an average particle size not larger than 100 μm;
      introducing said powder into a hollow space of said hollow supporting body; and
      heating said hollow supporting body.

23. A member according to claim 22 wherein said hollow supporting body comprises a metal or metallic alloy.

24. A member according to claim 22 wherein said powder is disposed on an inside surface only of said hollow supporting body, whereby a hollow space is defined therein and wherein an oxidizing gas is disposed in said hollow space.

25. A member comprising:
   an elongated hollow supporting body; and
   a filling of an oxide superconducting ceramic material within said elongate supporting body, said oxide superconducting ceramic material having a Tco 77 K or higher,
   said member formed by a process comprising:
      preparing a powder of said oxide superconducting ceramic material having a Tco 77 K or higher wherein said powder has an average particle size not larger than 100 μm;
      introducing said powder into a hollow space of said hollow supporting body; and
      heating said hollow supporting body while elongating said hollow supporting body.

26. A member according to claim 25 wherein said hollow supporting body comprises a metal or metallic alloy.

27. A member according to claim 25 wherein said powder is disposed on an inside surface only of said hollow supporting body, whereby a hollow space is defined therein and wherein an oxidizing gas is disposed in said hollow space.

28. A member comprising:
   an elongated hollow supporting body having inner walls; and
   a filling of an oxide superconducting material within said elongated supporting body, wherein said oxide superconducting material is disposed on said inner walls of said elongated hollow supporting body to provide an empty space therein.

29. An elongated member comprising:
   a hollow supporting body; and
   a filling of an oxide superconducting material within said elongated supporting body, said oxide superconducting ceramic material having a Tco of 77 K or higher, said member formed by a process comprising:
   preparing a powder of said oxide superconducting ceramic material having a Tco of 77 K or higher;
   coating an inside of said supporting body with said powder;
   heating said supporting body and said powder; and
   repeating the step of coating and the step of heating.

30. A member according to claim 29 wherein said powder is disposed on an inside surface only of said hollow supporting body, whereby a hollow space is defined therein and wherein an oxidizing gas is disposed in said hollow space.

31. An elongated member comprising:
   a hollow supporting body; and
   a filling of an oxide superconducting material within said elongated supporting body, said oxide superconducting ceramic material having a Tco of 77 K or higher, said member formed by a process comprising:

firing a starting oxide ceramic material so that said oxide ceramic material has a superconductivity of 77 K or higher;
grinding said oxide ceramic material into a powder;
introducing said powder into said supporting body; and
heating said supporting body and said powder.

32. A member according to claim 31 wherein said process further comprises a step of repeating the coating and heating steps in turn.

33. A member according to claim 31 wherein said powder has an average particle size not larger than 100 μm.

34. A member according to claim 31 wherein said hollow supporting body comprises a metal.

35. A member according to claim 4, 9, 16, 22, 25, 28 or 31 wherein said hollow supporting body comprises copper or a copper compound.

36. A member according to claim 4, 9, 16, 22, 25, 28 or 31 wherein said superconducting ceramic material comprises bismuth, strontium, calcium and copper.

37. A member according to claim 31 wherein said powder is disposed on an inside surface only of said hollow supporting body, whereby a hollow space is defined therein and wherein an oxidizing gas is disposed in said hollow space.

* * * * *